United States Patent
Duerr

(10) Patent No.: US 6,703,766 B2
(45) Date of Patent: Mar. 9, 2004

(54) FIBER COMPOSITE WITH A PIEZOELECTRIC SENSOR OR ACTUATOR INTEGRATED THEREIN

(75) Inventor: Johannes K. Duerr, Meersburg (DE)

(73) Assignee: Dornier GmbH, Friedrichshafen (DE)

( * ) Notice: Subject to any disclaimer, the term of this patent is extended or adjusted under 35 U.S.C. 154(b) by 23 days.

(21) Appl. No.: 09/887,563

(22) Filed: Jun. 25, 2001

(65) Prior Publication Data

US 2002/0021058 A1 Feb. 21, 2002

(30) Foreign Application Priority Data

Jun. 23, 2000 (EP) .......................................... 00113315

(51) Int. Cl.⁷ .......................................... H01L 41/053
(52) U.S. Cl. ........................................... 310/340
(58) Field of Search ................... 310/340, 341, 310/311

(56) References Cited

U.S. PATENT DOCUMENTS

| | | | | |
|---|---|---|---|---|
| 4,349,762 A | * | 9/1982 | Kitamura et al. | 310/332 |
| 4,503,416 A | * | 3/1985 | Kim | 338/99 |
| 4,807,294 A | * | 2/1989 | Iwata et al. | 381/190 |
| 4,849,668 A | | 7/1989 | Crawley et al. | 310/328 |
| 5,159,228 A | * | 10/1992 | Schaetzle | 310/338 |
| 5,404,067 A | * | 4/1995 | Stein et al. | 310/330 |
| 5,410,210 A | * | 4/1995 | Sato et al. | 310/363 |
| 5,869,189 A | * | 2/1999 | Hagood et al. | 428/461 |
| 5,869,767 A | * | 2/1999 | Hayward et al. | 73/774 |
| 5,920,145 A | * | 7/1999 | Wu et al. | 310/328 |
| 6,048,622 A | * | 4/2000 | Hagood et al. | 428/461 |
| 6,191,519 B1 | * | 2/2001 | Nye et al. | 310/316.01 |

FOREIGN PATENT DOCUMENTS

| | | | | |
|---|---|---|---|---|
| DE | 197 32 513 A1 | 7/1997 | | H01L/41/24 |
| EP | 0 483 955 A1 | 8/1991 | | H01L/41/04 |
| JP | 59-115580 | * | 7/1984 | 310/311 |

OTHER PUBLICATIONS

Copy of European Patent Office Search Report and translation of relevant portions thereof, Nov. 13, 2000 EP 00 11 3315.

* cited by examiner

Primary Examiner—Thomas M. Dougherty
(74) Attorney, Agent, or Firm—Crowell & Moring LLP

(57) ABSTRACT

A fiber composite component has a piezoelectric actuator or sensor integrated therein. Electric feed lines for the actuator or sensor are constructed in the form of electrically insulated thin wires which exit the fiber composite almost perpendicularly to the laminate layers, so that the fibers of the fiber composite component are not severed by the leading-out of the feed lines, but are slightly pushed apart.

9 Claims, 4 Drawing Sheets

FIBER COMPOSITE WITH A PIEZOELECTRIC SENSOR OR ACTUATOR INTEGRATED THEREIN

BACKGROUND AND SUMMARY OF THE INVENTION

This application claims the priority of European patent document 00 113 025.6 filed Jun. 23, 2000, the disclosure of which is expressly incorporated by reference herein.

The invention relates to a fiber composite with a piezoelectric sensor or actuator integrated therein.

In piezoelectric materials, such as quartz crystals or PZT-ceramics (PZT=lead-zirconate-titanate), an applied electric field results in elongations or contractions of the material. Piezoceramic actuators are therefore able to convert electric energy directly into mechanical energy and offer advantages, such as high actuating resolution, high actuating power and very short response times, while their size is small. This effect is reversible in the case of piezoelectric materials; that is, a time-variable mechanical elongation of such ceramics causes, a charge displacement between the electrodes which can, in turn, be tapped as an electric sensor signal. In combination with suitable sensors and control, actuator systems can be implemented which can automatically adapt (that is, are adaptive) to changed operating conditions.

Piezoceramic actuators and sensors are typically constructed as stack actuators, elongators and bending actuators. The former consist of stacks of thin piezoceramic disks which are elongated or shortened approximately linearly along the longitudinal stack axis under an exterior electric field. The two latter consist of thin ceramic plates which, as a rule, are flatly connected with a carrier structure and elongate the latter while an electric voltage is impressed and generate an electric signal when the structure is elongated. In an asymmetrical integration into the carrier structure, or in the controlling of a bimorph in opposite directions (bimorph=actuator or sensor consisting of at least two separately bonded and mutually insulated piezoelectric wafers which are arranged in two or more planes in a parallel and congruent manner above one another), by means of the actuators, bending moments can therefore also be induced. When such elongation is blocked, elongators and bending elements can be electrically controlled to transmit forces to the corresponding structure and, to a certain degree, increase its stiffness.

The induced elongations and curvatures, or forces and moments, of piezoceramic elongators and benders can be used for adaptive damping of structure vibrations and for the active shape control (that is, adaptation of the geometrical shape to the respective operating conditions). The combination of such elements with fiber composites (which, because of their excellent characteristics in comparison to conventional metallic materials, are increasingly used in highly stressed as well as highly precise structures—particular in the aerospace field) creates the unique possibility of embedding such actuators and sensors on the basis of piezoceramic materials directly into the structure, instead of applying them only to their surface. As a result, adaptive structures of light weight and high stability are obtained, which can be cost-effective in future systems, for both manufacturing and in continuous use.

The significant advantages favor integration of the actuators/sensors in comparison to the application to the component surface, can be summarized as follows:

Higher effectiveness of elongation transmission;
capacity for integration under a higher mechanical (pressure) prestress;
protection against environmental and media influences
maintenance of aerodynamic contours with little or no influence on the surface quality of a component.

In the meantime, a number of important fields of application for piezoceramic actuators and sensors, including suppression of vibrations, reduction of sound or shape control of adaptive structures have partially been implemented in the form of demonstrators as well as products. These include modern spacecraft as well as civil and military systems, such as launcher rockets, satellites, helicopters, aircraft, road and rail vehicles, but also submarines and torpedoes.

The problems encountered in integrating piezoceramic actuators in a fiber composite will be explained herein using as an example the QuickPack® of the U.S. manufacturer Active Control Experts (ACX) [ACX], illustrated in FIG. 1. Currently, this is the only commercially available piezoceramic actuator/sensor which appears to be usable on an industrial scale because of its module-type configuration with feed lines, electrically insulating encapsulation and mechanical stabilization of the brittle piezoceramics. ACX QuickPacks® are flat thin piezoceramic actuators and sensors which generate forces and elongations which, to a first approximation, are proportional to the applied electric field, and which are utilized primarily in the plane of the actuator. They consist as a rule of one (unimorph) or two piezoceramic wafers (bimorph) which are arranged above one another, are insulated with respect to one another and separately controllable.

When the two wafers are controlled in opposite directions, they can function as benders. The standard actuators have one or two wafers arranged behind one another in a plane. In special applications, also up to five-layer modules with up to 2×5 wafers per plane were manufactured [Hopk98], [Mans99], [Ditt99] and [Dürr99]. Original ACX QuickPacks® are provided primarily for the application to a structure by means of an epoxy resin adhesive.

The negative characteristics which are normally associated with piezoceramic actuators (brittleness, problematic electric contacting and lack of electric insulation) are largely eliminated in encapsulated piezoceramic actuators by a special manufacturing process: The electroded piezoelectric wafers are glued to thin polyimide foils in the thickness direction. Electric strip conductors made of copper are, in turn, applied to the polyimide foils. The latter are therefore bonded and are electrically mutually insulated, and also insulated with respect to the environment, by an additional thermoplastic border (spacer). Charge transmission takes place without additional process materials or soldering points, purely by virtue of the mechanical contact between the copper strip conductor and the electroding. At one end of the actuator, the individual polyimide foils, together with the imprinted strip conductors, are guided together to form a type of flat band cable (tail), which, in comparison to the dimensions of the actuator, is narrow and provided with a standard connector. In addition to a further mechanical stabilization and slight pressure prestressing of the encapsulated piezoceramic actuator, the polyimide foil is used as an additional protection against outside influences, such a moisture or dirt. Thus, the brittle and thin piezoceramic wafers can be handled and processed relatively easily [ACX]. The QuickPack® actuators mentioned as an example of encapsulated piezoceramic actuators can be obtained in a series of different configurations. The tests, on which the above-described invention is based, are carried out by means of QP20N actuators and are verified on QP40N actuators.

This actuator type is permissible only for temperatures of up to maximally 100° C.; at higher temperatures, parts of the plastic materials used for the encapsulating and gluing-together of the individual layers start to decompose; this generally leads to a massive delamination of the actuator, and to catastrophic destruction. However, modern high-capacity composite materials are generally manufactured at temperatures of up to 180°; sometimes, an additional cure cycle (post-cure) of components at still higher temperatures will be required.

The described tails of the QuickPack® actuators are incompatible with a structurally conformal integration in fiber composites, because guiding of the electric feed line out of a fiber composite component requires severing the cover layers on the actuator. The latter is necessarily accompanied by an intolerable reduction of the strength, destroying the advantage of a structural integration.

It is an object of the invention to provide a fiber composite structure with an integrated piezoceramic actuator or sensor whose electric feed lines can be guided out of the fiber composite with as few interferences as possible.

Another object of the invention is to provide such a structure in which the integration of the actuator or sensor leads to no significantly impaired mechanical characteristics.

Still another object of the invention is to produce such a fiber composite with an integrated actuator or sensor, in which particularly the structure and the quality of the surface of the fiber composite is to be maintained without any limitation.

These and other objects and advantages are achieved by the fiber composite according to the invention, in which the piezoceramic sensor or actuator integrated therein has feed lines for the sensor or actuator in the form of electrically insulated thin wires which extend out of the fiber composite perpendicular to the laminate layers, so that the fibers are not severed by the leading-out of the feed lines, but are only slightly pushed apart. This arrangement achieves the integration of the actuator or sensor into the fiber composite structure without a significant reduction of the strength characteristics of the component.

Within the component, the feed lines, in sections, can also be guided parallel to the laminate layers. As a result, the feed lines can exit the component at any point on its surface, independently of the installation site of the actuator.

Other objects, advantages and novel features of the present invention will become apparent from the following detailed description of the invention when considered in conjunction with the accompanying drawings.

DETAILED DESCRIPTION OF THE DRAWINGS

Figure 1A:
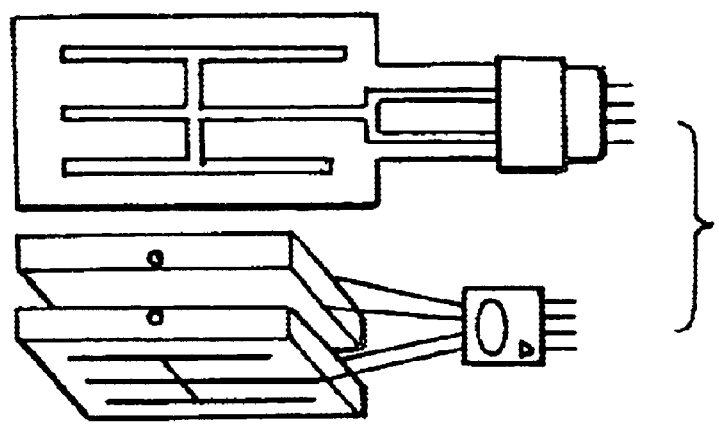
FIGS. 1.a and 1.b are a view of two piezoceramic actuators of a type which is particularly suitable for the invention.
Figure 1B:
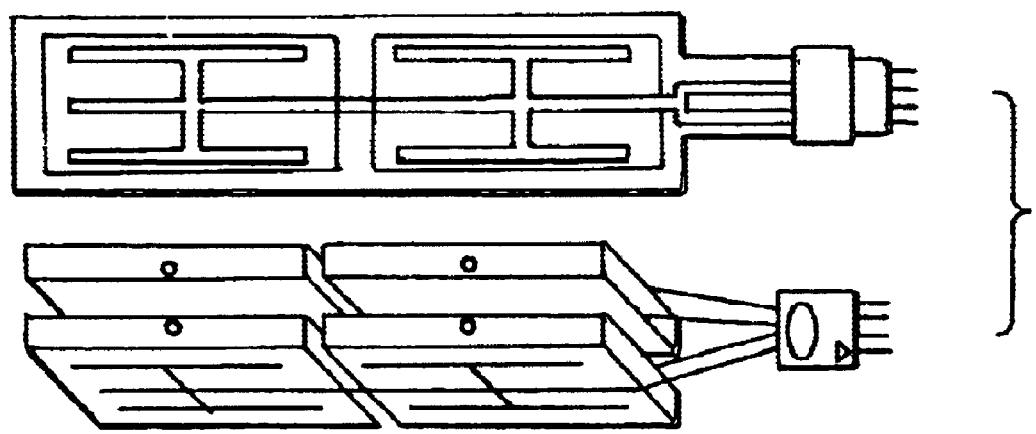

FIGS. 1.a and 1.b show two different piezoceramic actuators of the QuickPack® type of the firm ACX: QP20N (FIG. 1.a) as well a QP40N (FIG. 1.b). The construction of these actuators is explained above. Actuators of this or a similar type of construction are particularly suitable for the use according to the invention.

Modification on the Standard Actuator

As mentioned above, the tails of encapsulated piezoceramic actuators (such as QuickPack® actuators) are not compatible with a structurally conformal integration in fiber composites because the leading of such an electric feed line out of a fiber composite component requires severing the cover layers, necessarily resulting in an intolerable reduction of strength. The tail is therefore cut off close to the actuator and the copper strip conductors applied to the polyimide foils are partially ground, for example, by means of a fine diamond milling cutter. Electric connection can then be made via thin cables which are soldered onto the copper strip conductors by means of a suitable solder which must not liquefy in the environmental conditions existing during the production. Care should be taken in this case that the soldering point does not thicken and that the entire connection area does not exceed the thickness of the actuator. When the cables (such as a copper Φ0.2 mm or Φ0.5 mm insulated wire) are selected, care should be taken, on the one hand, that they are sufficiently electrically insulated and, on the other hand, will withstand the environmental conditions during the production without damage and in a fully operable manner. Likewise, the line cross-section, corresponding to the later operating range of the actuator, must be selected such that no heating of the electric feed line, and thus no fault or even damage to the structure, can occur. Another advantage of the modification of the electric feed line, as described, is a significant simplification of the handling of the feed lines in further production processes, because, for example, their length, can be adjusted arbitrarily.

The soldering points can be electrically insulated either by means of an epoxy resin, an insulating varnish or an insulating polyimide adhesive strip. (The product which is used, must again be able to withstand in a fully operable manner the environmental conditions during manufacturing.) Particularly, in the integration in carbon-fiber-reinforced plastic structures, complete electric insulation is absolutely necessary, because the cutting edge at the tail represents a frequent source of faults.

Integration Process

Figure 2A:
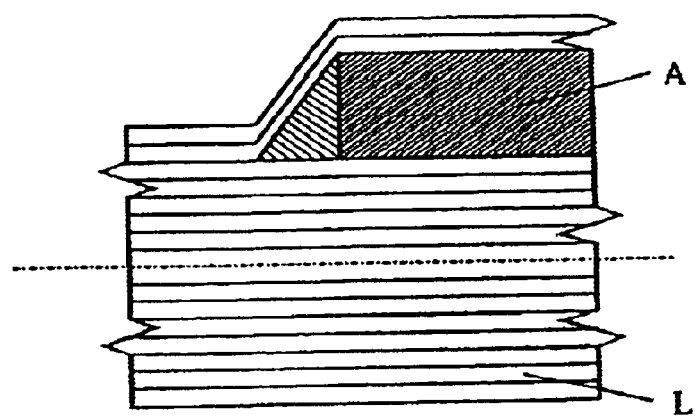
FIG. 2 is a schematic view of three embodiments of the component according to the invention, with different configurations of the integration of the actuator in the fiber composite component.
Figure 2B:
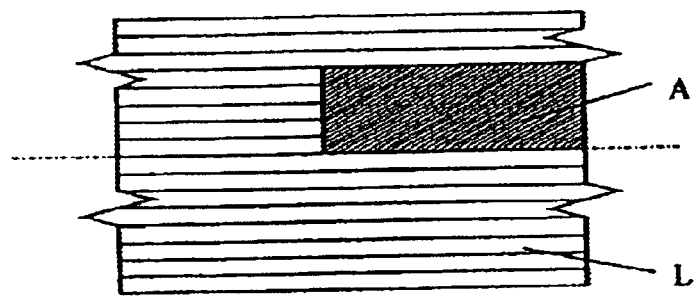
Figure 2C:
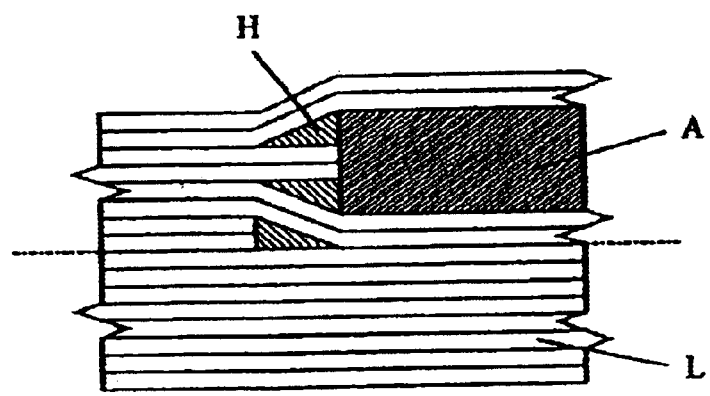

In the structural integration of the actuators into the fiber composite, generally a large number of different configurations are possible. Three specific configurations are illustrated as examples in FIG. 2. In all three, the actuator A is integrated in the fiber composite component; that is, the actuator is covered on both sides by at least one layer of the laminate L. In the construction according to FIG. 2.a, no laminate layers are severed for the integration of the actuator, which is placed between two adjoining layers of the laminate L. In the embodiment according to FIG. 2.b, recesses for the actuator A are provided in several laminate layers, while FIG. 2.c is a mixed form of the two previously described embodiments according to FIGS. 2.a and 2.b. In FIG. 2.c, individual layers are provided with recesses, whose entire thickness is, however, less than the height of the actuator A. The layers provided with the recesses are adjoined by layers without recesses. During the curing of the component, the resulting pockets H will be filled with resin.

Manufacture of the fiber composite structure according to the invention by means of prepreg or wet-laminating processes takes place using the normal steps up to the layers in which or on which the actuators are to be integrated. Test pieces according to FIG. 2 were produced from carbon-fiber-reinforced plastic prepreg material (T800/5245C, BASF Narmco) and tested. Layers severed in the area of the actuator are first laminated onto one another; then, the cutout for the actuator is made in these partial laminates by means of templates, taking into account the tail stub. These partial laminates are then (in a conventional manner) laminated onto the already existing laminate, which is not affected by the integration of the actuator, and are compressed in a vacuum. Finally, the actuator is inserted in the recess and, also in a vacuum, is pressed together with the laminate.

By means of a template and a fine needle, penetration points for the electric feed lines are marked in the cover layers (layers above the actuator), to which the peel-ply has been applied on one side. This technique ensures that the reinforcing fibers of the structures are only pushed apart, and not severed, which finally has a considerable effect on the strength of the component. Subsequently, the electric feed lines are guided through the cover laminate and tightened, and the laminate is pressed together with the remaining component. In principle, several wires can also be led through a common opening. In all operating steps, particularly consolidation in a vacuum, a buckling of the cables is to be avoided.

Figure 3:
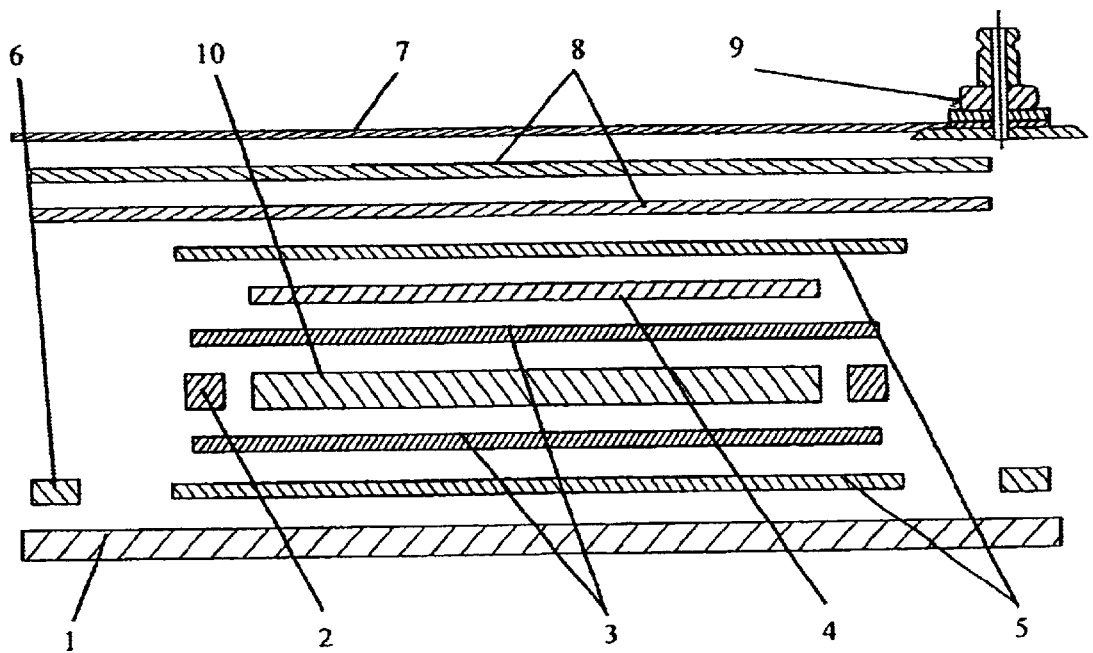
FIG. 3 shows the construction of an autoclave for producing the component according to the invention.
Figure 4:
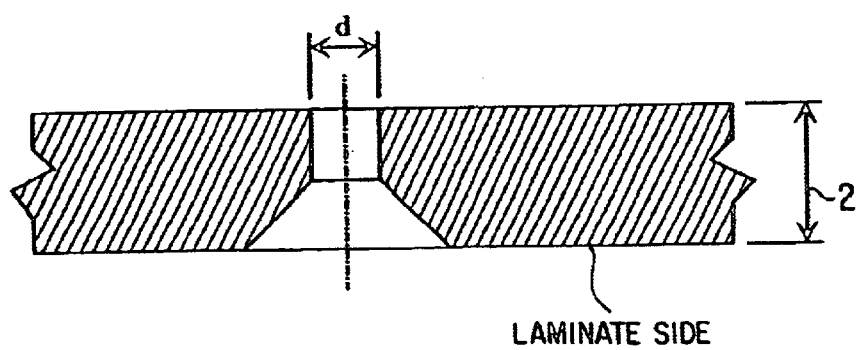
FIG. 4 is a view of a metal pressure sheet for producing the component according to the invention, in an autoclave.

A standard construction according to FIG. 3 is used for the baking of the fiber composite component in the autoclave. The reference numbers indicate the following:

1 base plate
2 edge strip
3 Teflon peel-ply
4 metal pressure sheet
5 release film
6 sealing tape (mastic)
7 vacuum bag
8 breather cloth
9 vacuum breach unit
10 fiber composite Instead of a massive pressure plate (normally, polished aluminum plate with $t \geq 12$ mm), a thin metal pressure plate 4 is used, as separately illustrated in FIG. 4. As a result of the correspondingly reduced stiffness, the slight thickening in this area, which is generally caused by the integration or application of the actuator, is taken into account; that is, pressing-out of the matrix in the corresponding section, when pressure is applied in the autoclave, will be reduced, and the mechanical characteristics of the fiber composite are therefore only slightly influenced.

Aluminum sheets of a thickness of 2 mm were found to be suitable for use as metal pressure sheets. At the points at which the electric feed lines emerge from the component (in the described process, any site on the surface of the fiber composite component), bores are made in the metal sheets. The latter have a diameter d which, in the case of the utilized thickness of the metal pressure sheet, should be approximately 1 mm above the diameter of the used electric conductor. From the laminate side, these bores are counter-bored a good 1 mm deep and are deburred. Finally, the metal pressure sheet is treated by means of conventional release agents. Instead of the above-mentioned bores, openings of any cross-section can be present in the metal pressure sheet, which are beveled on the laminate side.

In the area of the integrated encapsulated piezoceramic actuator or sensor, the metal pressure sheet may have a shallow depth recess (for example, 0.1–0.2 mm) on the laminate side in order to prevent a pressing-out of the matrix because of the thickening in this area.

When preparing the autoclave setup, care should be taken that the wires are tightly guided through the metal pressure sheets and, during the cure process, are not damaged or sheared off by the metal pressure sheet. As soon as the metal pressure sheet and the edge strips 2 are fixed, the bores, from which the wires are guided through the metal pressure sheet, are sealed off on both sides by means of several strips of sealing tape 6 and the wires are then loosely fixed on the metal sheet.

During the curing of the component, the pressure values and temperature values are particularly within the following ranges:
Pressure: 3–10 bar,
temperature: 120–220° C.

The described process and resulting structure have the following advantages:

Because the wires are guided out of the laminate perpendicularly to the surface, which can occur at any location because the wires can be continued without any significant disturbance of the laminate characteristics in the plane, the usually required edge trimming of the components is permitted. This was not possible in such a simple manner in the prior art solutions disclosed in the literature.

The use of metal pressure sheets instead of massive pressure pieces largely maintains the characteristics of the fiber composite structure, so smoother geometrical transitions can be created in the component in the areas of the integrated actuators, while mechanical stress concentrations are significantly reduced.

By guiding the electrical feed lines through the metal pressure sheet precisely at the points at which they emerge from the laminate, the perfect surface quality of the component is completely maintained.

Countersinking of the bores in the metal pressure sheet significantly reduces the danger of damage to or of shearing off the electric feed lines, and leads to higher permissible tolerances during the manufacturing.

The use of sealing tape at the outlet points protects the electric feed lines on the metal sheet against (breaking-off) buckling.

Since pressure is applied in the autoclave (generally 7 bar outside the autoclave construction) before the rise in temperature (generally 180° C.) liquefies the matrix, a portion of the sealing tape applied around the bores is pressed through the gaps between the wire and the metal pressure sheet and completely fills the truncated cone formed by the countersinking of the metal sheet. (No air pockets are created in this case, because of the fact that the component inside the autoclave construction is simultaneously acted upon by the vacuum.)

This results in the following advantages:

Excellent sealing-off of the bores; no resin outflow with the corresponding negative consequences on the mechanical characteristics of the component.

Absolutely planar surface at the points of the exiting of the wire from the laminate by the isostatic pressure distribution already before the liquefaction of the matrix.

Because the sealing tape is pressed in the gap between the metal pressure sheet and the wire, no gluing-together of the metal pressure sheet and the wire can occur by the emerged matrix.

The small gap between the metal pressure sheet and the wire minimizes the tensile or pushing force to be overcome for lifting-off the metal pressure sheets after the curing of the component, minimizing the danger that the wires are torn off. The metal pressure sheets can easily be detached from the component.

An example of the manufacturing process according to the invention by means of the autoclave method has been described. An adaptation to other manufacturing methods for fiber composites, for example, to the RTM process (resin transfer molding) or processes derived therefrom is easily conceivable. No significant limitations occur, particularly as far as the modification of the vacuum construction is concerned.

Detailed studies have demonstrated that the catastrophic destruction of the QuickPack® actuators in the case of the above-described processing according to the prior art is most probably caused by sublimation of the internal adhesive layers and partially sublimation of the thermoplastic spacers at temperatures above approximately 100° C., which cause large-surface delaminations in the actuator. Such destruction of encapsulated piezoceramic actuators can be prevented by an application of pressure applied simultaneously with the temperature load.

The cure cycle of some matrix systems includes a tempering process (post-cure for the complete cross-linking of the matrix) which, primarily for reasons of cost, is not necessarily carried out in the autoclave, in the case of fiber composite structures with QuickPacks® embedded according to the above-described process. Accordingly, this tempering process can be carried out only by the application of unidirectional pressure and heat. For the carbon-fiber-reinforced plastic system (T800/5245C) used here, a tempering process of 4 h @ 210° C. is provided. However, in order to avoid stressing the actuators above the temperature level existing in the autoclave, the temperature of the tempering process was lowered to this temperature (180° C.), so that the duration for complete post-cure-cross-linking simultaneously had to be significantly increased. By means of the ILS-values (interlaminar shear strength, compare EN 2563) of a number of samples, the modified post-cure cycle for the carbon-fiber-reinforced plastic system used here was determined to be 16 h @ 180° C., a pressure of 7–10 bar being applied in a hot press. Here, different forms of the (mechanical) application of pressure are definitely also conceivable, which do not require high mechanical expenditures. In order to ensure a uniform application of pressure to the actuators, a rubber layer of a thickness of between 15 to 20 mm was found to be suitable which is kept away from a direct contact with the component by several layers of a dense Teflon film. The danger of mechanical depolarization of the actuators or of transverse pressure failure of the fiber composite does not exist at these pressures.

Figure 5:
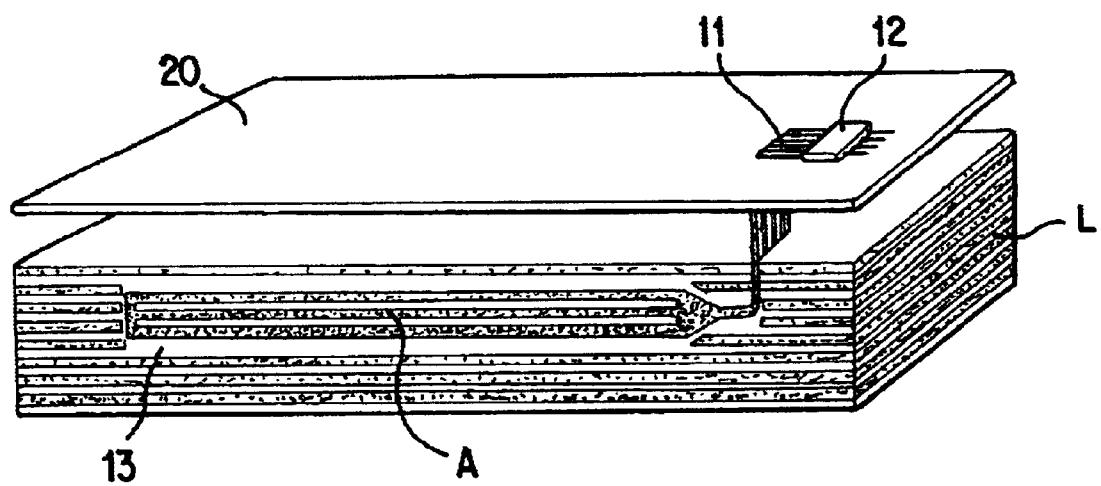
FIG. 5 is a view of another embodiment of the component according to the invention.

FIG. 5 is a schematic illustration of the construction of a finished component according to the invention. The actuator A is surrounded by an insulating foil 13 and is arranged within the individual layers of the laminate L. For the integration of the actuator A, recesses are provided in several laminate layers. (The configuration of the integration of the actuator A therefore corresponds to that illustrated in FIG. 2.b.) According to the invention, the electric feed lines 11 are guided out of the component perpendicularly through the cover layers 20, thus perpendicularly to the plane of the component. Optionally, outside the component, a plug-type connection 12 may be provided for the contacting of the feed lines 11.

The above-described embodiments of the invention were explained by means of the integration of QuickPack® actuators. However, the invention is not limited to this type of actuator but, particularly with respect to the guidance and electrical insulation of feed lines as well as the vacuum construction for the baking in the autoclave and the approach during the tempering, can also be applied to other actuators, such as the Active Fiber Composites (AFCs)/SmartPly® according to U.S. Pat. No. 5,869,189 made of piezoceramic fibers and developed by Continuum Control Corporation [CCC]. Likewise, the described approach is not limited to carbon-fiber-reinforced plastics or duroplastics, but can also be used, for example, for thermoplastic glass-fiber-reinforced plastic systems.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A fiber composite structure having laminate layers, with a piezoelectric actuator or sensor integrated therein, wherein:
    electric feed lines for the actuator or sensor comprise electrically insulated thin wires;
    said wires exit the fiber composite almost perpendicularly to the laminate layers, whereby fibers of the fiber composite structure are not severed by exiting of the feed lines, but are rather slightly pushed apart.

2. The fiber composite according to claim 1, wherein the feed lines have a diameter of less than 1 mm.

3. The fiber composite according to claim 2, wherein the feed lines have a diameter of less than 0.5 mm.

4. The fiber composite according to claim 1, wherein the feed lines are guided within the fiber composite in sections parallel to the laminate layers.

5. The fiber composite according to claim 2, wherein the feed lines are guided within the fiber composite in sections parallel to the laminate layers.

6. The fiber composite according to claim 1, wherein the wires are fastened on the actuator or sensor by one of a conductive adhesive and a solder.

7. The fiber composite according to claim 1, wherein insulation of contact points between the actuator or sensor and the electric feed lines is provided by one of an epoxy resin, an insulating varnish or an insulating polyimide foil.

8. The fiber composite according to claim 1, wherein recesses for the actuator or sensor are provided in the laminate layers.

9. The fiber composite according to claim 1, wherein the actuator or sensor is integrated between two successive laminate layers without recesses.

* * * * *